United States Patent
Wavering

(10) Patent No.: US 9,059,129 B2
(45) Date of Patent: Jun. 16, 2015

(54) MICRO-DIE NATURAL CONVECTION COOLING SYSTEM

(71) Applicant: Hamilton Sundstrand Corporation, Windsor Locks, CT (US)

(72) Inventor: Jeffrey T. Wavering, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 397 days.

(21) Appl. No.: 13/628,565

(22) Filed: Sep. 27, 2012

(65) Prior Publication Data

US 2014/0085824 A1 Mar. 27, 2014

(51) Int. Cl.
*H05K 7/20* (2006.01)
*H01L 23/40* (2006.01)
*H01L 23/373* (2006.01)

(52) U.S. Cl.
CPC ......... *H01L 23/3735* (2013.01); *H01L 2224/16* (2013.01); *H01L 2224/73253* (2013.01); *H01L 23/4006* (2013.01)

(58) Field of Classification Search
USPC .................. 361/679.54, 704, 709–710, 719; 165/80.2–80.3, 185; 257/706–707, 713
See application file for complete search history.

(56) References Cited

U.S. PATENT DOCUMENTS

| | | | |
|---|---|---|---|
| 2,711,382 A * | 6/1955 | Smith-Johannsen | 156/227 |
| 4,535,386 A | 8/1985 | Frey, Jr. et al. | |
| 5,185,691 A | 2/1993 | Korinsky | |
| 5,258,888 A | 11/1993 | Korinsky | |
| 5,383,340 A | 1/1995 | Larson et al. | |
| 5,486,652 A * | 1/1996 | Kasper | 174/75 R |
| 6,259,602 B1 * | 7/2001 | Malhammar | 361/704 |
| 6,411,513 B1 * | 6/2002 | Bedard | 361/704 |
| 6,691,769 B2 | 2/2004 | Johnson et al. | |
| 6,724,629 B1 * | 4/2004 | Augustin et al. | 361/704 |
| 6,755,240 B2 * | 6/2004 | Werninger | 165/46 |
| 7,147,041 B2 * | 12/2006 | Mitchell et al. | 165/80.3 |
| 7,355,855 B2 * | 4/2008 | Karidis et al. | 361/710 |
| 7,355,856 B2 | 4/2008 | Petroski | |
| 7,362,582 B2 * | 4/2008 | Karidis et al. | 361/710 |
| 7,545,647 B2 * | 6/2009 | Karidis et al. | 361/710 |
| 7,545,648 B2 * | 6/2009 | Karidis et al. | 361/710 |
| 7,869,209 B2 | 1/2011 | Nemoz et al. | |

FOREIGN PATENT DOCUMENTS

| | | | | |
|---|---|---|---|---|
| DE | 3738897 A1 * | 5/1989 | | H05K 7/20 |
| JP | 08250878 A * | 9/1996 | | H05K 7/20 |

* cited by examiner

*Primary Examiner* — Robert J Hoffberg
(74) *Attorney, Agent, or Firm* — Kinney & Lange, P.A.

(57) ABSTRACT

A cooling system for an integrated circuit die comprises a heat exchanger and a heat transfer device. The heat transfer device is formed of a plurality of stacked foils. The stacked foils are fused at a heat exchanger region abutting the heat exchanger, and are fused at a die region abutting the integrated circuit die, but are flexible between the heat exchanger region and the die region.

16 Claims, 3 Drawing Sheets

MICRO-DIE NATURAL CONVECTION COOLING SYSTEM

BACKGROUND

The present invention relates generally to electronics cooling, and more particularly to system for natural convection cooling of an integrated circuit die.

Like other electronic components, microprocessors are typically rated to a safe operating temperature above which component degradation and damage are more likely to occur. Microprocessors continue to decrease in physical size while increasing in process capacity and corresponding heat output. As a result, microprocessor cooling systems must be made capable of dissipating larger amounts of heat from smaller contact points. A variety of systems exist to provide cooling for microprocessors, including forced convention cooling. Forced convection cooling relies on relatively cool airflow driven by a fan or bled from a pressurized air source, and accordingly requires power and fault monitoring.

Modern microprocessors are often mounted on ball grid array (BGA) chip carriers that fan out connections from the microprocessor to provide contact points to a printed wiring board via solder balls. These solder balls expand and contract from thermal cycling during normal operation, thereby causing changes in the height of the BGA chip carrier and the microprocessor die. Microprocessor dies are typically relatively fragile. If constrained by a hard attached heat exchanger that directly loads the die, the resulting stress can fracture the die during thermal cycling.

SUMMARY

The present invention is directed toward a cooling system for an integrated circuit die. The cooling system comprises a heat exchanger and a heat transfer device. The heat transfer device is formed of a plurality of stacked foils. The stacked foils are fused at a heat exchanger region abutting the heat exchanger, and are fused at a die region abutting the integrated circuit die, but are flexible between the heat exchanger region and the die region.

DETAILED DESCRIPTION

Figure 1A:
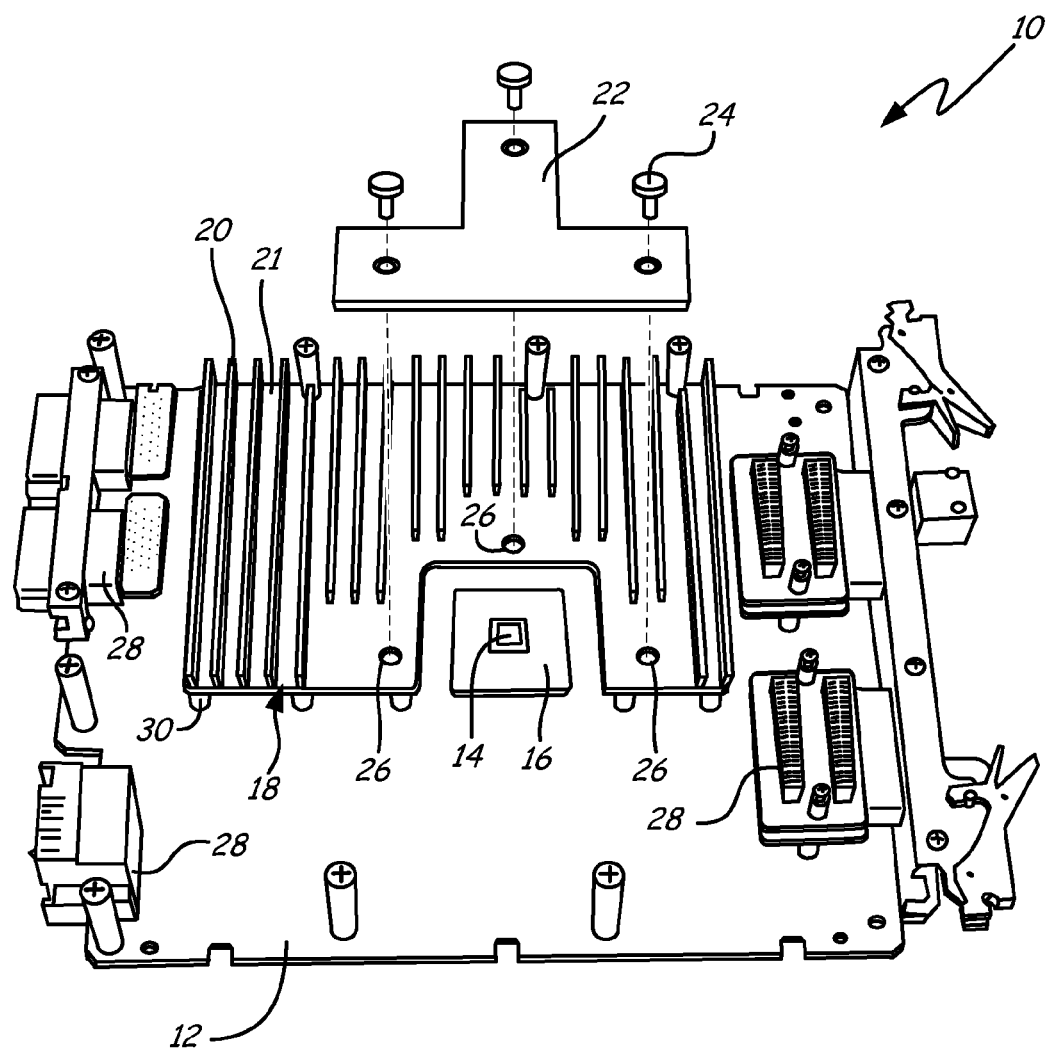
FIG. 1a is a disassembled perspective view of a circuit board with microprocessor die and associated cooling system.
Figure 1B:
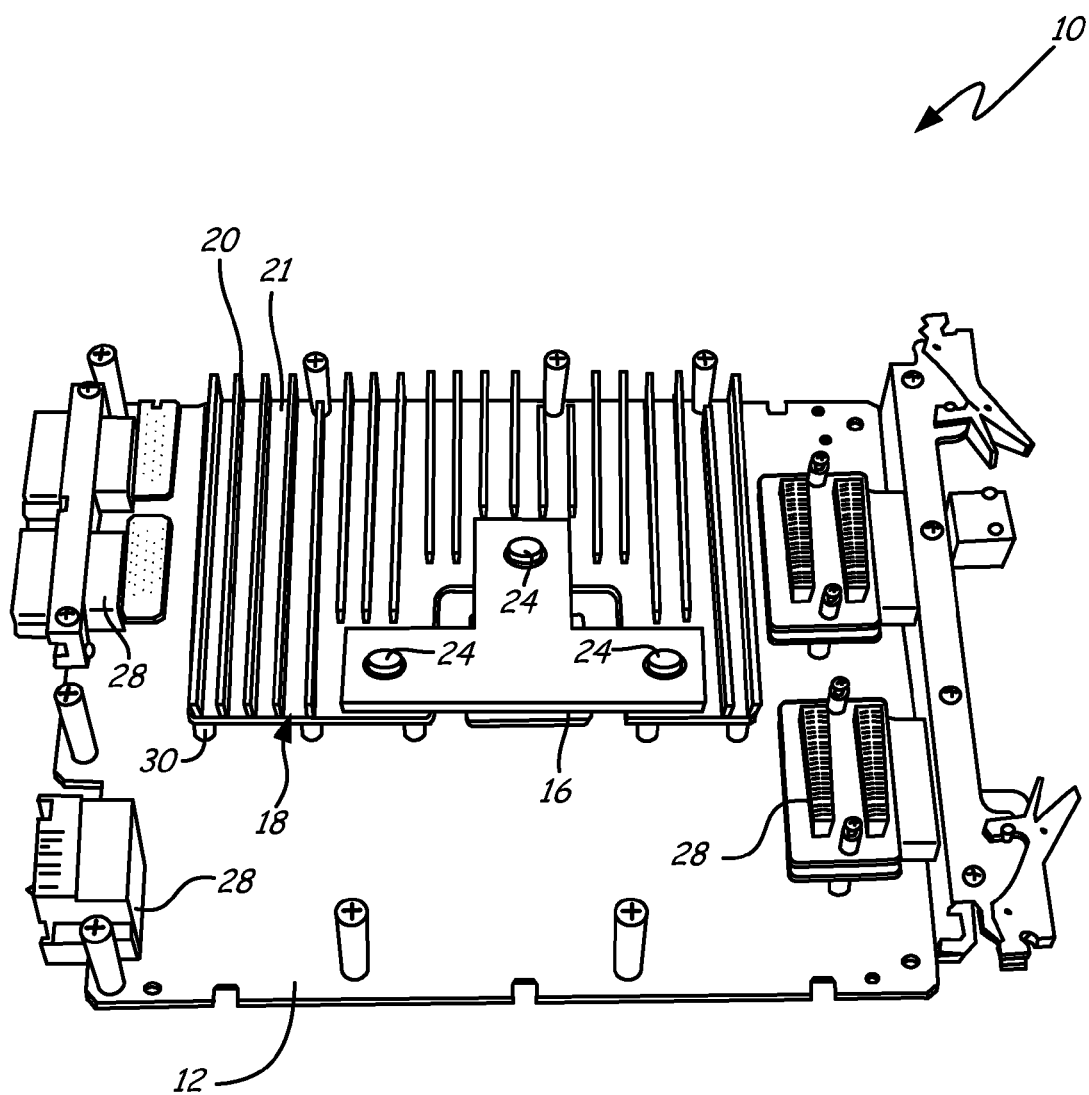
FIG. 1b is an assembled perspective view of the circuit board of FIG. 1

FIGS. 1a and 1b are perspective views of electronics system 10 with printed wiring board 12, die 14, ball grid array (BGA) chip carrier 16, heat exchanger 18 (with fins 20), heat transfer device 22, fasteners 24, fastener holes 26, peripheral electronics 28, and posts 30. FIG. 1a shows a disassembled state of electronics system 10 wherein heat transfer device 22 and fasteners 24 are not secured to printed wiring board 12, while FIG. 1b shows an assembled state of electronics system 10 wherein fasteners 24 are threaded into fastener holes 26 to secure heat transfer device 22 atop die 14.

Printed wiring board 12 is a circuit board substrate to which a plurality of electronic components, including die 14 and peripheral electronics 28, are attached. Printed wiring board 12 serves as a mounting location for these components, and may additionally include a plurality of integral traces forming electrical connections between these components. Die 14 is a semiconductor integrated circuit die such as a microchip, microcontroller, or microcomputer die that may produce more than 9 Watts of heat. In some embodiments, the top surface of die 14 exposed in FIG. 1a may have an area of less than 0.3×0.3 inches. Die 14 is rated to a safe operating temperature $T_{safe}$. Operation above safe operating temperature $T_{safe}$ may cause damage or degradation to die 14.

BGA chip carrier 16 is an interface device that fans out connections from die 14 to connection points on printed wiring board 12 via conductive solder balls (see FIGS. 2 and 3, below). BGA chip carrier 16 may, for instance, be a polymer platform with embedded conductive interconnect traces extending from contact points on die 14 to contact points on printed wiring board 12. Peripheral electronics 28 may constitute a wide range of electronic components mounted to printed wiring board 12, such as data and power connectors, memory and other storage devices, and secondary processors. Some or all of peripheral electronics 28 may be connected to die 14 via traces in printed wiring board 12. In some embodiments, some of peripheral electronics 28 may be formed in a substrate of printed wiring board 12.

Heat exchanger 18 is a structure configured to dissipate heat from die 14 via natural convection. In some embodiments one or more of peripheral electronics 28 may also be attached to heat exchanger 18 to dissipate heat. Heat exchanger 18 comprises a plurality of fins 20 extending from plate 21. Fins 20 and plate 21 are formed of a rigid material with high thermal conductivity, such as aluminum or copper so as to conduct heat from die 14 out to all regions of heat exchanger 18 as uniformly as possible. Heat exchanger 18 may be supported at a distance from printed wiring board 12 by means of posts 30 to increase natural convective airflow across heat exchanger 18. Posts 30 are rigid supports that extend from printed wiring board 12 to heat exchanger 18. In some embodiments, posts 30 may extend through heat exchanger 18 to support and space additional elements stacked atop heat exchanger 18. Heat exchanger 18 is selected to cool die 14 below safe temperature $T_{safe}$ via natural convection.

Heat transfer device 22 comprises a plurality of thermally conductive foil layers fused together in locations adjacent die 14 and heat exchanger 18, but unfused in intervening regions, as described below with respect to FIGS. 2 and 3. Heat transfer device 22 provides a thermal connection between die 14 and heat exchanger 18 without mechanically loading die 14. In this way, heat transfer device 22 avoids stressing or fracturing die 14 when the height of BGA chip carrier 16 and die 14 rises or falls due to thermal cycling during normal operation. Heat transfer device 22 is shown as a T-shaped section extending from die 14 to heat exchanger 18 in three directions. In other embodiments heat transfer device 22 may take the form of a thermally conductive bridge extending in only one direction from die 14 to heat exchanger 18, or an L-shaped section or "band-aid" section extending from die 14 to heat exchanger 18. More generally, heat transfer device may take any cutout shape suited to fit die 14 and heat exchanger 18, although higher wattage embodiments of die 14 may require embodiments of heat transfer device 22 with more or wider thermal paths between die 14 and heat exchanger 18.

Fasteners 24 extend through heat transfer device 22 and into fastener holes 26 in plate 21 to secure heat transfer device 22 to heat exchanger 18. Fasteners 24 may, for instance, be threaded bolts tightened into corresponding threads in fastener holes 26. In alternative embodiments, fasteners 24 may be replaced by clamps or welds to secure heat transfer device 22 to heat exchanger 18.

Figure 2:
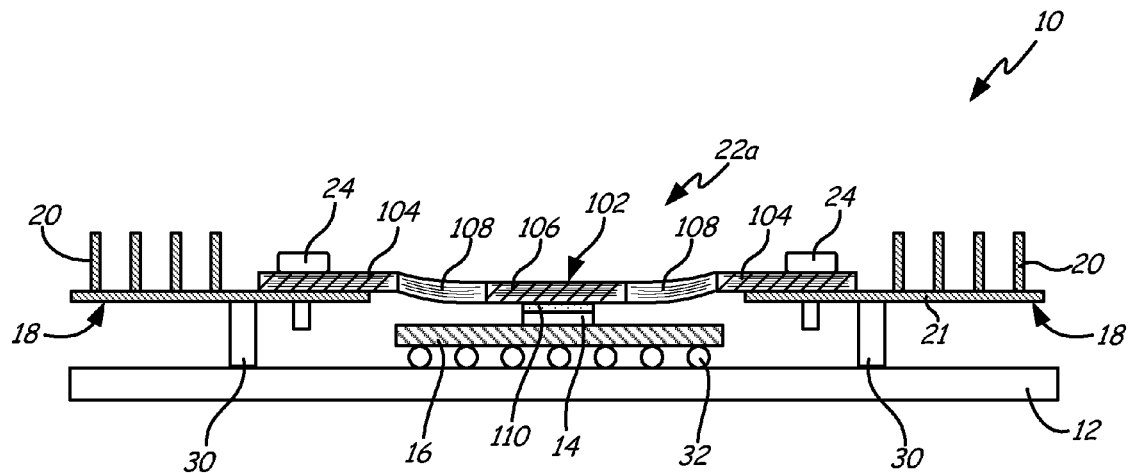
FIG. 2 is a cross-sectional view of one embodiment of the microprocessor die and cooling system of FIG. 1.

FIG. 2 is a cross-sectional view of one embodiment of a region of electronics system 10 near die 14. FIG. 2 depicts printed wiring board 12, die 14, BGA chip carrier 16, heat exchanger 18, fins 20, plate 21, heat transfer device 22a, fasteners 24, posts 30, and solder balls 32. Heat transfer device 22a is one embodiment of heat exchanger 22, and comprises foil thermal conductor 102 (with fused heat exchanger regions 104, fused die region 106, and unfused intermediate regions 108) and adhesive interface 110. As described above with respect to FIGS. 1a and 1b, heat transfer device 22a carries heat from die 14 to heat exchanger 18, which dissipates heat via natural convection. Fins 20 extend from plate 21 for added surface area to increase heat dissipation, and posts 30 space heat exchanger 18 apart from printed wiring board 12 to improve airflow around heat exchanger 18. BGA chip carrier 16 provides electrical connections between die 14 and printed wiring board 12 via embedded conductive traces attached to printed wining board 12 by solder balls 32. Solder balls 32 are very small conductive solder points that may expand and contract from environmental thermal cycling. If constrained during this cycling, solder balls 32 may become damaged and fail due to stress cracking.

As noted above, foil thermal conductor 102 is formed from a plurality of vertically stacked, conductive foil layers. The thickness of each layer is selected to allow flexibility, and may for instance be $1/1000^{th}$ of an inch or less. Foil thermal conductor 102 may comprise a greater or larger number of foil layers depending on the wattage of die 14, e.g. 100, 200, or more layers. More layers provide a broader thermal bridge to heat exchanger 18, allowing more heat to be dissipated from die 14. Layers may, in some embodiments, be formed of aluminum, silver, or copper, and may be die cut into the shape shown in FIGS. 1a and 1b.

Foil layers of foil thermal conductor 102 are fused together at fused heat exchanger regions 104 (adjacent heat exchanger 18) and fused die region 106 (adjacent die 14) to form rigid sections with improved vertical thermal conductivity across fused layers, but with little or no flexibility. Fused heat exchanger regions 104 and fused die region 106 may, for instance, be sinter welded using a combination of pressure, vibration, and heat. Foil layers of foil thermal conductor 102 are not fused together in intervening unfused intermediate regions 108, which accordingly remain flexible. This flexibility of unfused intermediate regions 108 allows fused die region 106 to ride up and down with die 14 and solder balls 32 during thermal cycling. In this way, foil thermal conductor 102 provides a heat bridge between die 14 and heat exchanger 18 that applies negligible compressive load on die 14, thereby avoiding stressing and fracture of die 14.

Foil thermal conductor 102 is secured to heat exchanger 18 by fasteners 24 at fused heat exchanger regions 104, and to die 14 by adhesive interface 110 at fused die regions 106. In some embodiments, conductive interface material such as thermal grease may be applied between heat exchanger 18 and foil thermal conductor 102 to improve thermal conduction therebetween. Adhesive interface 110 is a layer of binding material such as epoxy formed between fused die region 106 of foil thermal conductor 102 and a flat surface of die 14. Adhesive interface 110 is selected to introduce as little thermal resistance as possible between foil thermal conductor 102 and die 14 while retaining fused die region 106 in contact with die 14 during changes in height of die 14 due to reflow of solder balls 32.

Figure 3:
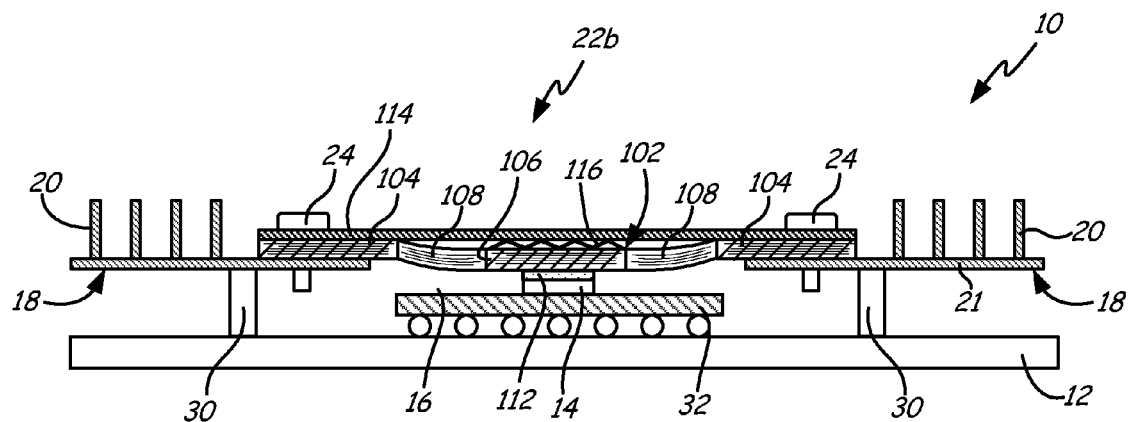
FIG. 3 is a cross-sectional view of a second embodiment of the microprocessor die and cooling system of FIG. 1.

FIG. 3 is a cross-sectional view of an alternative embodiment of electronics system 10 near die 14. FIG. 3 depicts printed wiring board 12, die 14, BGA chip carrier 16, heat exchanger 18, fins 20, plate 21, heat transfer device 22b, fasteners 24, posts 30, and solder balls 32. FIG. 3 differs from FIG. 2 only in heat transfer device 22b, an alternative embodiment of heat exchanger 22. In addition to foil thermal conductor 102 (discussed above with respect to FIG. 2), heat transfer device 22b comprises thermal interface 112, pressure plate 114, and spring 116. As described above with respect to FIG. 2, thermal conductor 102 acts as a thermal bridge with flexible unfused intermediate regions 108 between fused heat exchanger regions 104 and fused die region 106 on heat exchanger 18 and die 14, respectively.

Heat transfer device 22b foregoes adhesive interface 110 in favor of thermal interface 112, a non-adhesive layer selected to improve thermal conduction between die 14 and fused die region 106. Thermal interface 112 may, for instance, be a thermal pad or a layer of thermal grease. Because thermal interface 112 does not secure thermal conductor 102 to die 14 as adhesive interface 110 does, heat exchanger 22b includes pressure plate 114 and spring 116. Pressure plate 114 is a rigid plate secured atop thermal conductor 102. In the depicted embodiment, fasteners 24 secure both pressure plate 114 and thermal conductor 102 to heat exchanger 18. In alternative embodiments, pressure plate 114 may be secured atop thermal conductor 102 by separate means. Pressure plate 114 need not directly abut thermal conductor 102 at fused heat exchanger regions 104. In some embodiments the height of pressure plate 114 relative to thermal conductor 102 may be adjusted, e.g. with intervening spacers. The height of pressure plate 114 is selected to allow die 14 to rise during thermal cycling without directly compressing fused die region 106 of thermal conductor 102 against die 14. Instead, fused die region 106 is held in contact with die 14 by spring 116, a light spring such as a leaf spring selected to apply only enough compressive force on fused die region 106 to prevent fused die region 106 and die 14 from separating due to thermal cycling or vibration. Heat transfer device 22b provides a better thermally between die 14 and heat exchanger 18 at the cost of a slight increase in mechanical complexity over heat transfer device 22a.

In all of its embodiments, heat transfer device 22 provides a thermal bridge between die 14 and heat exchanger 18, thereby allowing die 14 to be cooled by natural convective heat flow. Heat transfer device 22 includes flexible unfused intermediate regions 108 to avoid endangering die 14 with large compressive loads during thermal cycling that causes the vertical position of die 14 to vary during ordinary operation.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A cooling system for an integrated circuit die, the cooling system comprising:

a heat exchanger adjacent the integrated circuit die; and
a heat transfer device formed of a plurality of stacked foils, the plurality of stacked foils having:
- a die region abutting the integrated circuit die,
- a heat exchanger region abutting the heat exchanger,
- an intermediate region separating the die region and the heat exchanger region,
- wherein each of the stacked foils extends from the die region through the intermediate region to the heat exchange region,
- wherein all of the plurality of stacked foils in each of the die region and the heat exchanger region are fused together throughout using sinter welds between all adjacent foils among the plurality of stacked foils forming a rigid section, and
- wherein the all of the plurality of stacked foils in the intermediate region are unfused allowing the intermediate region to be flexible.

2. The cooling system of claim 1, further comprising an adhesive interface securing the integrated circuit die to the die location of the heat transfer device.

3. The cooling system of claim 1, wherein the adhesive interface is an epoxy layer selected to impede thermal conduction between the heat transfer device and the integrated circuit die as little as possible.

4. The cooling system of claim 1, further comprising:
a pressure plate secured to the heat exchanger; and
a spring disposed between the pressure plate and the die location of the heat transfer device to retain the heat transfer device in contact with the integrated circuit die.

5. The cooling system of claim 4, further comprising a thermal interface layer between the integrated circuit die and the die location of the heat transfer device.

6. The cooling system of claim 5, wherein the thermal interface layer is a layer of thermal grease or a thermal pad for providing thermal conduction between the heat transfer device and the integrated circuit die.

7. The cooling system of claim 4, wherein the spring is a leaf spring.

8. The cooling system of claim 1, wherein the integrated circuit die and the heat exchanger are mounted on a printed wiring board.

9. The cooling system of claim 8, wherein the integrated circuit die is mounted on the printed wiring board via a ball grid array secured to the printed wiring board with solder balls.

10. The cooling system of claim 1, further comprising at least one additional fused heat exchanger region of the heat exchanger device, the at least one additional fused heat exchanger region abutting the heat exchanger.

11. The cooling system of claim 1, wherein the plurality of stacked foils are formed of aluminum, silver, or copper.

12. The cooling system of claim 1, wherein the plurality of stacked foils comprises one hundred or more stacked foils.

13. The cooling system of claim 12, wherein the plurality of stacked foils comprises two hundred or more stacked foils.

14. The cooling system of claim 1, wherein each of the plurality of stacked foils is $1/500^{th}$ of an inch thick, or less.

15. The cooling system of claim 1, wherein each of the plurality of stacked foils is $1/1000^{th}$ of an inch thick, or less.

16. A cooling system for an integrated circuit die, the cooling system comprising:
a heat exchanger adjacent the integrated circuit die; and
a heat transfer device formed of a plurality of stacked foils, the plurality of stacked foils having:
- a die region abutting the integrated circuit die,
- a plurality of heat exchanger regions, each heat exchanger region abutting the heat exchanger, and
- a plurality of intermediate regions, each of the intermediate regions separating the die region and a respective one of the heat exchanger regions,
- wherein all of the plurality of stacked foils in each of the die region and the heat exchanger regions are fused together throughout forming a rigid section, and
- wherein the all of the plurality of stacked foils in each of the intermediate regions are unfused allowing each of the intermediate regions to be flexible.

\* \* \* \* \*